United States Patent [19]
Bakke

[11] Patent Number: 5,049,084
[45] Date of Patent: Sep. 17, 1991

[54] ELECTRICAL CIRCUIT BOARD INTERCONNECT

[75] Inventor: Stephen M. Bakke, Gales Ferry, Conn.

[73] Assignee: Rogers Corporation, Rogers, Conn.

[21] Appl. No.: 446,085

[22] Filed: Dec. 5, 1989

[51] Int. Cl.$^5$ ............................................... H01R 9/09
[52] U.S. Cl. ...................................... 439/ 66; 439/74; 439/591; 439/884
[58] Field of Search ................... 439/66, 74, 591, 884, 439/886

[56] References Cited

U.S. PATENT DOCUMENTS

| | | | |
|---|---|---|---|
| 3,795,037 | 3/1974 | Luttmer | 439/591 |
| 4,479,685 | 10/1984 | Kirby | 439/591 |
| 4,634,199 | 1/1987 | Anhalt et al. | 439/66 |
| 4,793,814 | 12/1988 | Lifcak et al. | 439/66 |
| 4,871,316 | 10/1989 | Herrell et al. | 439/74 |

OTHER PUBLICATIONS

Loeffel et al., *IBM Technical Disclosure Bulletin*, vol. 20, No. 4, (Sep. 1977).

*Primary Examiner*—Paula A. Bradley
*Attorney, Agent, or Firm*—Fish & Richardson

[57] ABSTRACT

A connector arrangement for providing electrical interconnection between corresponding contact pads of opposed first and second circuit boards includes an electrically nonconductive support member disposed between the boards, a bodily-rotatable, electrically conductive interconnect element, generally of dumbbell shape, extending through the thickness of the support and having a pair of pad engagement surfaces disposed to engage the respective contact pads, and a clamp for retaining the circuit boards in a clamped-together relationship with the support member in a compressed, reduced thickness state and with the interconnect member bodily rotated. The support member includes a resilient elastomeric material, has support surfaces respectively opposed to the board surfaces, and is adapted to be compressed by urging of the boards together. A line projected through the engagement surfaces at the time of their initial engagement upon the contact pads is disposed at an initial, acute angle to the direction of thickness of the support member, and, when being rotated, the same line lies at an acute angle to the direction of thickness of the support greater than the initial angle, the body of the support being locally deformed by the interconnect element and resiliently biasing the interconnect towards its original position, into engagement with the pads.

20 Claims, 5 Drawing Sheets

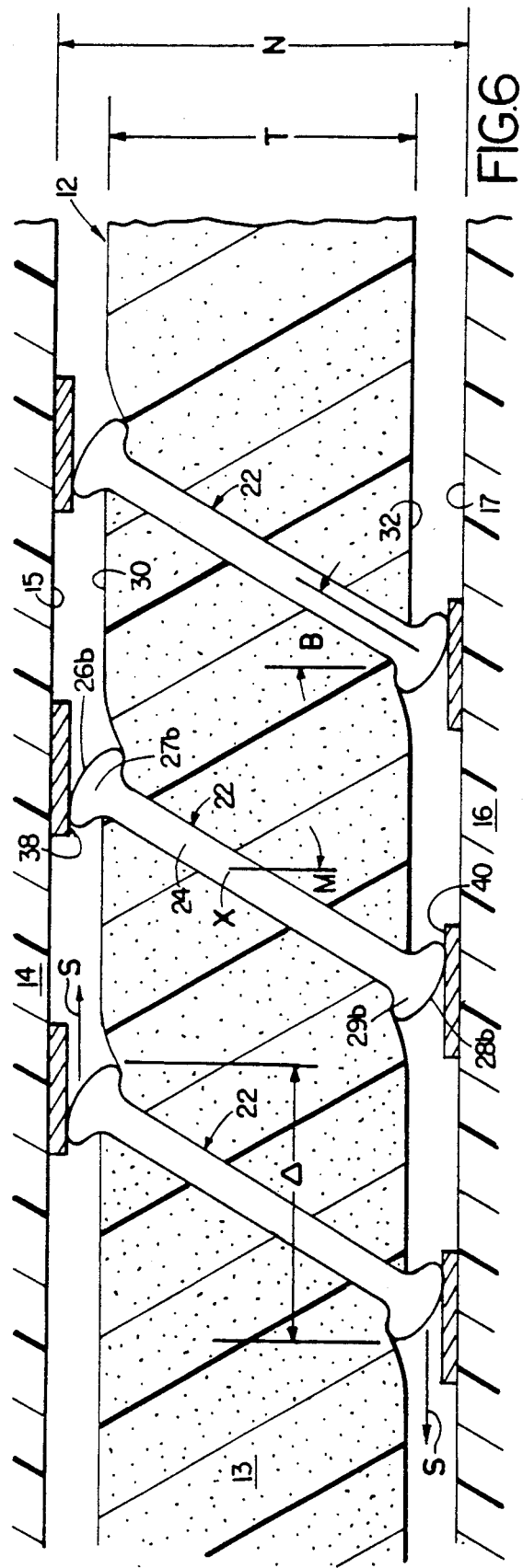
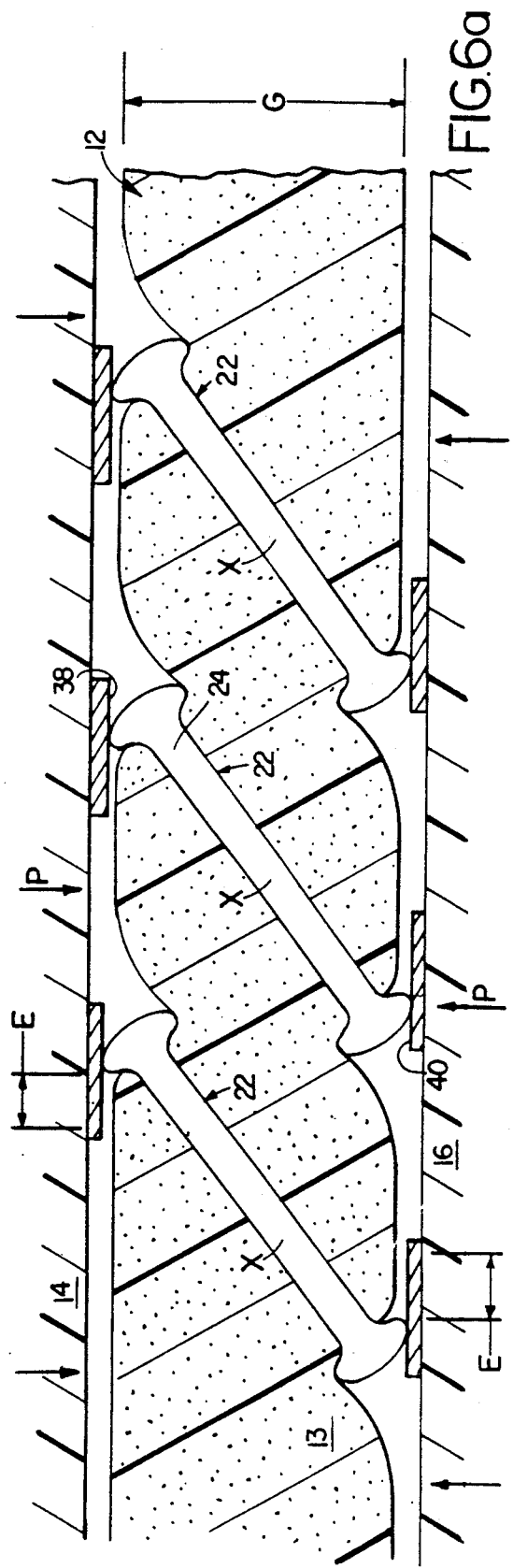

ELECTRICAL CIRCUIT BOARD INTERCONNECT

This invention relates to devices for interconnecting contact pads of opposed circuit board surfaces.

Electrical interconnection between opposed circuits has, in the past, been provided by pin-and-socket engagement, e.g., as shown in Welu U.S. Pat. No. 4,249,787. It has also been known to provide interconnection via resilient conductors disposed in matrixes, including solid or foam elastomer, e.g., as shown in Lamp U.S. Pat. No. 4,003,621, Luttmer U.S. Pat. No. 3,795,037, Sado U.S. Pat. No. 4,295,700, and Cherian et al. U.S. Pat. No. 4,161,346 and U.S. Pat. No. 4,199,209. It has also been suggested to employ connection devices consisting of a line of conductor sheets supported in a housing on elastically deformable rolls extending the length of the housing, as shown in Bonnefoy U.S. Pat. No. 4,445,735.

It has further been shown to employ S-shaped interconnect elements disposed in an elastomer matrix, e.g., Zifcak et al. U.S. Pat. No. 4,793,814 shows S-shaped interconnect elements having pairs of tabs for engaging contact pads associated with each opposed circuit.

It has further been suggested to employ interconnect elements having convex wiping surfaces to provide a camming relationship between the interconnect element and contact traces, e.g. as shown in Cosmo U.S. Pat. No. 4,593,961.

The objectives of the present invention include providing a connector arrangement having improvement in one or more of the following features: consistency of contact stresses during repeated connector compression/decompression cycles, minimal deformation of the connector element, high contact density, simplicity of design, ease of manufacture, predictability of the effect of temperature and time on performance, and contact pad wiping during compression.

SUMMARY OF THE INVENTION

According to the invention, a connector arrangement for providing electrical interconnection between a plurality of first contact pads arranged on a surface of a first circuit board and a plurality of corresponding second contact pads on an opposed surface of a second opposed circuit board, the area array connector device including an electrically nonconductive support member adapted to be disposed between the circuit boards and including resilient elastomer material, the support member having support surfaces to be respectively opposed to the surfaces of the first and second circuit boards, and a plurality of bodily-rotatable, electrically conductive interconnect elements, each interconnect element including an axially elongated, rigid body member extending generally in the direction of the thickness of the resilient elastomer support member, a first terminal member, and a second terminal member, each terminal member disposed generally coaxially with the body member, the first and second terminal members defining pad engagement surfaces disposed about the axis and in a manner to engage the respective corresponding contact pads, a line projected through the pad engagement surfaces being disposed at an acute angle to the direction of thickness of the support member, and the first and second terminal members further defining support member engaging surfaces disposed about the axis and at least closely in opposition to the support surfaces of the support member to engage upon the support surfaces during bodily rotation of the interconnect element whereby, when the area array connector device is disposed between the circuit boards in a clamped-together relationship with the interconnect element in registry with their respective corresponding contact pads and with the interconnect elements rotated bodily as a result of the clamping so that the line projected through the pad engagement surfaces of each element lies at an acute angle, are supported by the elastomer support member to bear with force upon the contact pads.

In preferred embodiments, the pad engagement surfaces and the support member engagement surfaces are disposed generally symmetrically about the axis. The pad engagement surfaces are rounded convexly. The interconnect element has a first body diameter in the region of the body adjacent the terminal member and a second terminal diameter in the region of the terminal member between the pad engagement surface and the support member engagement surface, the second diameter being greater than the first diameter. The interconnect element is disposed in an aperture extending generally through the support member, the aperture having a diameter generally corresponding to the first body diameter of the interconnect element, the support member engagement surfaces of the terminal elements of the second, greater diameter adapted to bear upon the opposite surfaces of the support member in a manner to resist displacement of the terminal members into the support member. The resilient elastomeric material comprises a foam defining a distribution of voids, the voids serving locally to accommodate bodily rotation of the interconnect elements in a manner avoiding disturbance of adjacent elements whereby displacement of the elastomeric foam material of the support member about each interconnect element is limited generally to the local region of the element.

Other features and advantages of the invention will be understood from the following description of the presently preferred embodiment, and from the claims.

PREFERRED EMBODIMENT

We first briefly describe the drawings:

FIGS. 6 and 6a are enlarged side section views of a segment of the circuit of FIG. 1 showing the circuit segment in assembled and compression states.

Figure 1:
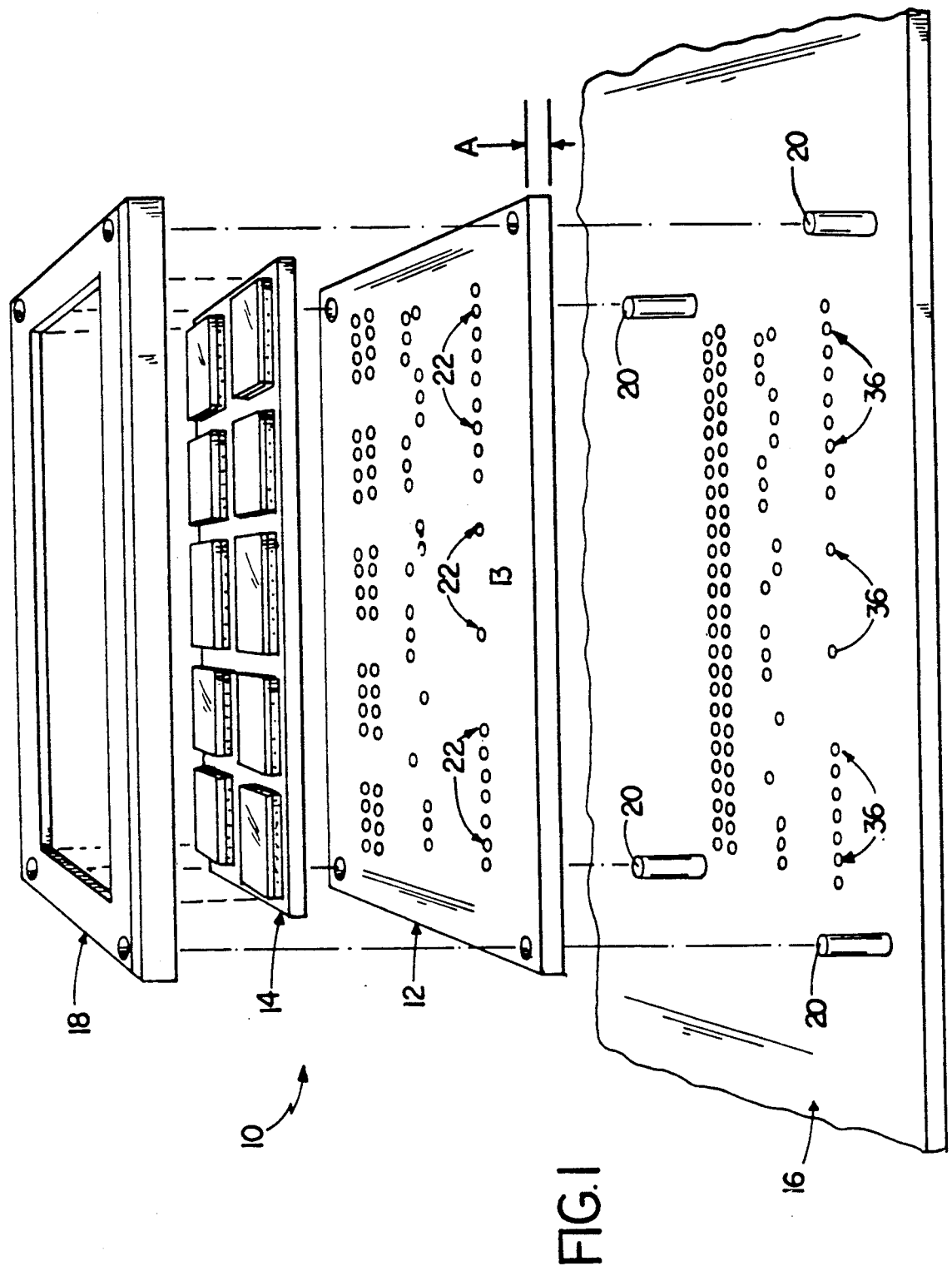
FIG. 1 is an exploded view in perspective of a circuit including a preferred embodiment of the connector arrangement of the invention.

Referring to FIG. 1, the electrical circuit 10 consists of connector arrangement 12 disposed between first and second electrical circuit boards 14, 16. Clamping frame 18 is provided for fixed assembly of the circuit over alignment posts 20.

Area array connector arrangement 12 consists of a sheet-form support member 13 of planar expanse, having uncompressed thickness, A, e.g., between about 0.025 inch and 0.500 inch, and preferably about 0.109 inch, including resilient, electrically nonconductive elastomeric material in the form of open cell foam having a density in the range of about 2 to 65 lbs/ft$^3$ preferably about 25 to 55 lbs/ft$^3$ (compared to a material density of about 65 lbs/ft$^3$), for an air or cell volume in the range of about 0% to 95%, preferably about 10 to 40%.

The support member has a characteristic compression force deflection (CFD) in the range of 2 to 50 lbs per square inch at 25 percent compression, and has a compression set, tested by ASTM Test Standard D 3574, of less than 10% compression set after 22 hours at 158° F. at 50% compression with one-half hour recovery. The foam material of support member 13 preferably urethane, silicone or natural rubber, although the specific material employed is less critical than the physical characteristics mentioned above, and other suitable materials may also be employed, e.g., copolymers of butadiene-styrene, butadiene-acrylonitrile, butadiene-isobutylene, chloroprene polymers, polysulfide polymers, plasticized vinyl chloride and acetate polymers and copolymers. Where the elastomeric foam material is urethane, the average void diameter is of the order of about 125 microns.

Area array connector 12 also consists of a multiplicity of interconnect elements 22, e.g., as shown in FIGS. 2b through 2g, disposed in the support member 13, and positioned selectively in the plane of the connector array, with element body 24 extending through the aperture in the support member to expose contact pad engagement surfaces 26, 28 adjacent connector array surfaces 30, 32. The relative positions of the engagement surfaces are predetermined to correspond, when assembled, to the positions of contact pads on the opposed circuit board surfaces.

Figure 2A:
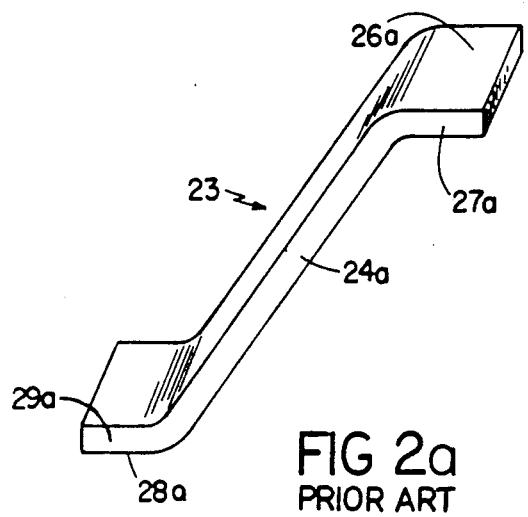
FIG. 2a is an enlarged perspective view of a prior art S-shaped interconnect element.

Referring to FIG. 2a, an interconnect element 23 as described and claimed in Zifcak, U.S. Pat. No. 4,793,814, the disclosure of which is incorporated herein by reference, is shown. In Zifcak, S-shaped interconnect element 23 consists of body 24(a) and tabs 27(a), 29(a) of electricity-conducting material, e.g., copper or other metal or metal-coated resin (provided the volume of metal is sufficient for the desired level of conductance, typically less than 1 ohm for power applications and less than 25 milliohms for signal applications).

Figure 2B:
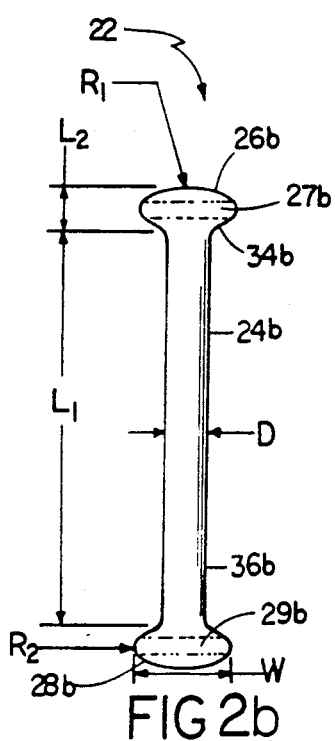
FIGS. 2b through 2g are enlarged perspective views of preferred embodiments of the interconnect element in the connector arrangement of FIG. 1.
Figure 2C:
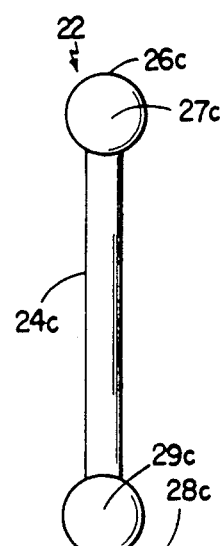
Figure 2D:
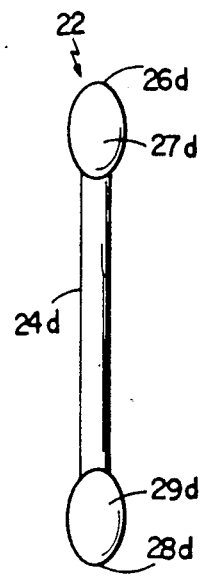
Figure 2E:
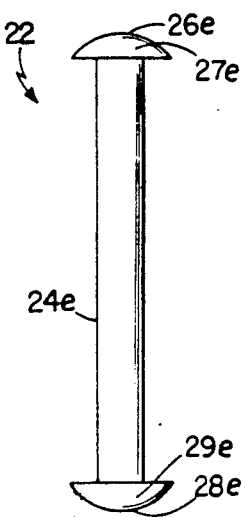
Figure 2F:
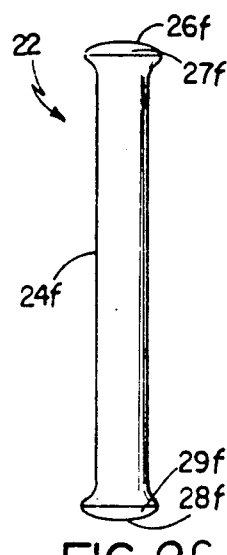
Figure 2G:
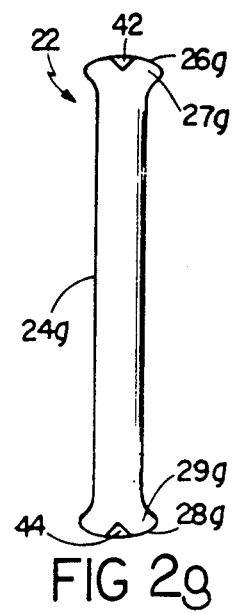
Figure 3:
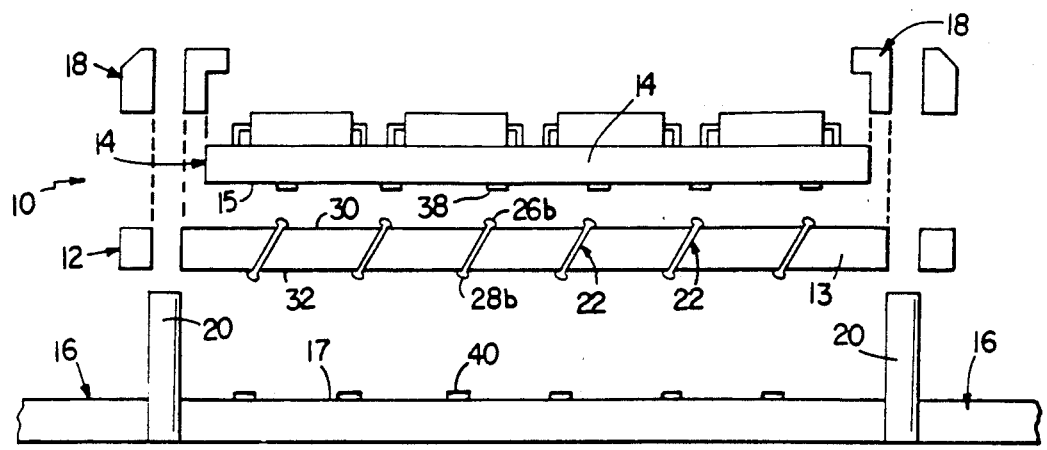
FIGS. 3, 4 and 5 are somewhat diagrammatic side section views of the circuit of FIG. 1, respectively showing the circuit in exploded, assembled and compression states.

Referring to FIG. 2b, a preferred embodiment of the interconnect element of the invention is shown. This interconnect element 22 comprises a rod-like body 24(b), terminated at each end by terminal members 27(b), 29(b), respectively. At least one terminal member 27(b), 29(b) is sized and shaped to facilitate insertion of interconnect element 22 into the support member during assembly and to hold element 22 in place after assembly. More specifically, terminal member 27(b) operates as an arrowhead, with pad engagement surface 26(b) being rounded convexly or otherwise tapered to spread the support member material during insertion.

To resist displacement of the terminal member into the support member after assembly, each terminal member 27(b), 29(b) is chosen to have a relatively large width W. Width W is sufficiently greater than the diameter D of rod like body 24(b), and that of the aperture in support member 13, that the terminal member engages the support member to resist removal of element 22 from the aperture.

Preferably, element 22 is symmetric as depicted in FIG. 2b, thereby eliminating the need to orient element 22 during assembly, e.g. as with S-shaped element 23 shown in FIG. 2a. Further the symmetric shape simplifies the manufacture of the interconnect element thereby lowering its cost.

Figure 4:
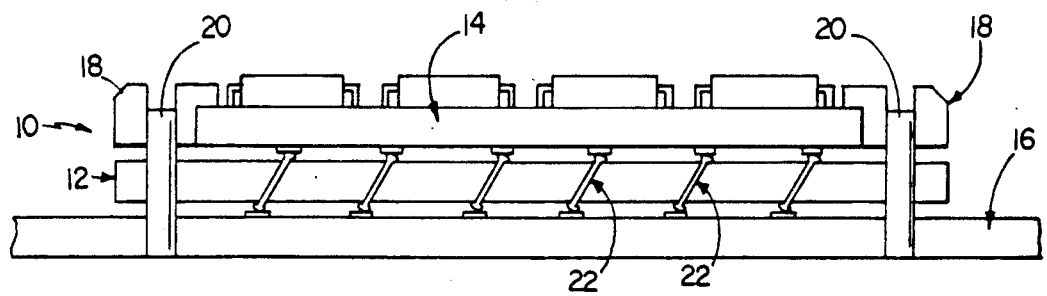

In the preferred embodiment shown, element 22 has a rod diameter D, in the range of about 0.0085 to 0.0115 inches, and a rod length $L_1$ selected to extend at angle B generally through the support member between surfaces 30, 32 in the uncompressed state (FIGS. 4 and 6). Each terminal member 27(b), 29(b) preferably has a length $L_2$ of approximately 0.012 inch, and a width W in the range of 0.019 to 0.023 inches representing the diameter of the terminal member at its widest point. Further, each pad engagement surface 26(b), 28(b) is preferably defined in part by a first radius $R_1$ of approximately 0.020 inch and a second radius $R_2$ of approximately 0.005 inch.

Element 22 is preferably constructed of the electrically conductive materials described in Zifcak U.S. Pat. No. 4,793,814 or of plated hard plastic, or molded silver alloy with gold plating.

Referring to FIG. 6, when disposed in the support member in the assembled, uncompressed state, body 24 preferably lies at acute angle B, to the direction of thickness of the support member (the normal line between surfaces 30,32), angle B, being in the range of about 0 to 70°, preferably about 10° to 40° and optimally about 30° to 35°.

Disposed above and below area array connector arrangement 12 are circuit boards 14, 16 having board surfaces 15, 17 respectfully opposed to connector array surfaces 30,32. Disposed on the board surfaces are contact pads 38,40, in the embodiment shown having thickness of about 0.001 inch.

Figure 5:
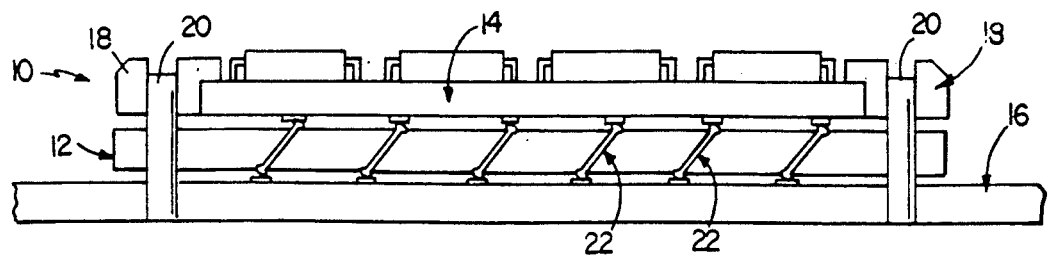

When assembled (FIG. 4), each contact pad 38 of board 14 lies in electricity-conductive contact with the opposed contact pad engagement surface 26 of the interconnect element 22, which extends through the support member 13 to electricity-conductive contact between contact pad engagement surface 28 and contact pad 40 of the opposed circuit board 16. The pairs of contact pads connected via element 22 are offset from each other, and the element is configured in a manner to cause the element to move bodily in the support member as compressional force is applied to the opposed board, as shown in FIGS. 5 and 6a, and described in more detail below.

Referring again to FIG. 6, the circuit 10 is shown in assembled state, with area array connector 12 disposed between circuit boards 14,16. Interconnect elements 22 extend through the support member 13, with contact pad engagement surfaces 26, 28 of terminal members 27, 29 disposed in contact with contact pads 38, 40. The centers of the opposed contact pads to be electrically interconnected are offset from each other by a distance, Δ, e.g., about 0.080 inch, and the support member engagement surfaces engage the respective planar surfaces 30, 32 of the support member 13. In this uncompressed state, with interconnect elements just contacting the contact pads, the circuit boards are separated by a distance N equal to about 136% of the uncompressed thickness T of the support of member 13 (e.g., N=109 mils).

Referring to FIG. 6a, upon application of compression force to the opposed boards, represented by arrows, P, the gap between board surfaces 15, 17 is decreased to distance, G, equal to from between 130% to about 75% of T, preferably about 118%, (e.g., in the embodiment shown, G is about 0.095 inch). The combination of the structure of the interconnect elements 22, the relationship of the elements to the material of the surrounding support member matrix, and the angle of the line projected through the contact pad engagement surfaces of the interconnect element at the time of their initial engagement upon the contact pad surfaces causes the interconnect elements to move bodily within the support member by rotation, e.g. about axes, X, on the support member centerline to a greater acute angle without significant flexing of the interconnect element. The cellular open nature of the foam of support member 13 allows the member to give resiliently by a decrease in size of the foam voids, without significant adverse affect on the position of surrounding adjacent interconnect elements. As the interconnect element rotates, the contact pad engagement surfaces also move along the opposed surfaces of the contact pads, indicated by arrows, S, over a distance, E, in a wiping action that removes oxides, dust particles and the like from the contacting surfaces for improved electricity-conducting contact. (Where angle B is about 30%, the length, E, is typically about 0.010 inch.)

As mentioned, the interconnect elements rotate without significant flexing or deformation. As a result, when pressure, P, is removed, the resilience to return the conductor element to essentially its original position, as shown in FIG. 6, is provided entirely by the resilience of the support member.

The positions of interconnect elements in the support member are predetermined, and apertures are formed at precise locations, e.g., by numerically controlled drilling. The elements may also be cast in place, or the support member may be cast in a manner to provide apertures at the desired positions. Interconnect elements 22 may be used with generally round apertures in lieu of the slotted apertures required with S-shaped elements 23 (e.g., Zifcak et al. U.S. Pat. No. 4,793,814). Each round aperture requires less area than a slotted aperture since the slotted aperture must be large enough to accommodate the bent tab of S-shaped element 23.

Further, with a given angular displacement, elements 22 provide greater wiping action than S-shaped elements 23. Since less angular displacement is required, elements 22 may be grouped more closely together without touching after compression. Further, the reduction in angular displacement operates to reduce the extent to which the elastomer foam of support member 13 is distorted by the interconnect elements during full compression. Accordingly, a solid elastomer 13, which is more resistant to distortion than the foam, may be used. The solid elastomer will push back on the interconnect elements with a greater force than the foam to thereby provide more contact force for the same degree of angular displacement.

Other embodiments are within the following claims. For example, terminal members 27, 29 may be shaped as spheres 27(c), 29(c) (FIG. 2c); prolated spheroids 27(d), 29(d) (FIG. 2d); full or partial hemispheres 27(e), 29(e) (FIG. 2e); bulbs 27(f), 29(f) (FIG. 2f); or modified bulbs 27(g), 29(g) (FIG. 2g) wherein each modified bulb 27(g), 29(g) has an indent 42,44 near the center of the pad engagement surface 26(g), 28(g).

Figure 7:
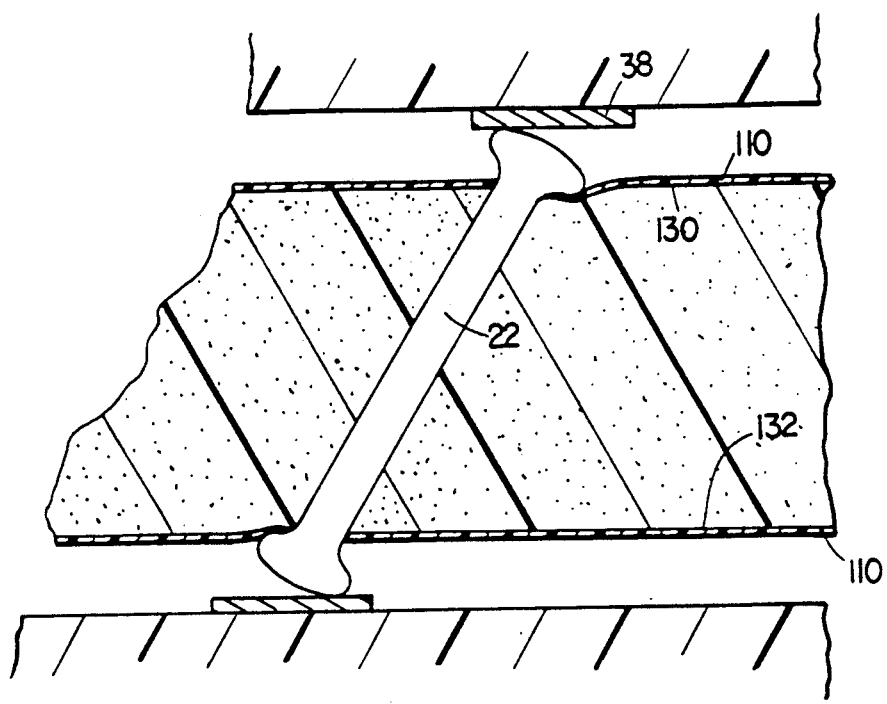
FIGS. 7 and 7a are enlarged side section views of a segment of the circuit of FIG. 1 showing the circuit with alternative embodiments of the support member.

The support member may be an open cell foam or may be of other construction providing the desired voids. Referring to FIG. 7, the support member may include a sheetform layer 110 of generally nondistensible material, e.g., Mylar ® or woven fiberglass mat, disposed upon support member surfaces 130, 132, the modulus of elasticity of the material of the film allowing application of higher compressional force without adversely affecting performance of the connector arrangement, and also permitting adjustment of the co-efficient of thermal expansion of the connector arrangement.

Figure 7A:
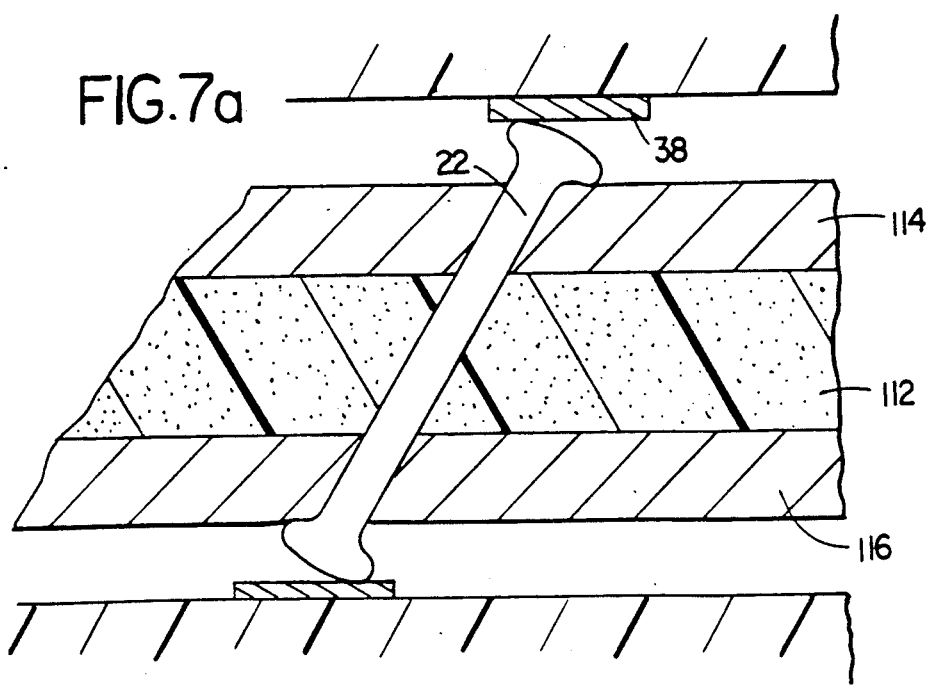

Referring to FIG. 7a, similar results may be achieved using a layer of open cell foam 112 sandwiched between layers 114, 116 of solid elastomer.

What is claimed is:

1. An area array connector device for providing electrical interconnection between a plurality of first contact pads arranged on a surface of a first circuit board and a plurality of corresponding second contact pads on an opposed surface of a second opposed circuit board, said area array connector device comprising an electrically nonconductive support member adapted to be disposed between the circuit boards and comprising resilient elastomer material, said support member having support surfaces to be respectively opposed to the surfaces of the first and second circuit boards, and a plurality of bodily-rotatable, electrically conductive interconnect elements, each said interconnect element comprising an axially elongated, preformed rod-like rigid body member inserted in, and extending generally in the direction of the thickness of the resilient elastomer support member, a first terminal member, and a second terminal member, each said terminal member having a width sufficiently greater than the diameter of said rigid body member to resist removal of said interconnect element from said elastomeric support member, said terminal members being disposed generally coaxially with said body, and shaped to provide pad engagement surfaces about said axis capable of proper engagement with the respective contact pads regardless of orientation of the element about its axis, a line projected through said pad engagement surfaces being disposed at an acute angle to the direction of thickness of said support member, and said first and second terminal members further defining support member engaging surfaces disposed about said axis and at least closely in opposition to said support surfaces of said support member to engage upon said support surfaces during bodily rotation of said interconnect element whereby, when said area array connector device is disposed between the circuit boards in a clamped-together relationship with said interconnect elements in registry with their respective corresponding contacts pads and with said interconnect elements rotated bodily as a result of said clamping so that said line projected through said pad engagement surfaces of each element lies at an acute angle, said interconnect elements are supported by said elastomer support member to bear with force upon the contact pads.

2. The area array connector device of claim 1 wherein said pad engagement surfaces are disposed generally symmetrically about said axis.

3. The area array connector device of claim 2 wherein said support member engagement surfaces are disposed generally symmetrically about said axis.

4. The area array connector device of claim 3 wherein said pad engagement surfaces are rounded convexly.

5. The area array device of claim 4 wherein said interconnect element has a first body diameter in the region of said body adjacent said terminal member and a second terminal diameter in the region of said terminal member between said pad engagement surface and said support member engagement surface, said second diameter being greater than said first diameter.

6. The area array device of claim 5 wherein said interconnect element being disposed in an aperture extending generally through said support member, said aperture having a diameter generally corresponding to said first body diameter of said interconnect element, the support member engagement surfaces of said terminal elements of said second, greater diameter adapted to bear upon the opposite surfaces of said support member in a manner to resist displacement of said terminal members into said support member.

7. An area array connector device for providing electrical interconnection between a plurality of first contact pads arranged on a surface of a first circuit board and a plurality of corresponding second contact pads on an opposed surface of a second opposed circuit board, said area array connector device comprising an electrically nonconductive support member adapted to be disposed between the circuit boards and comprising resilient elastomeric foam material, defining a distribution of voids said support member having support surfaces to be respectively opposed to the surfaces of the first and second circuit boards and being adapted to be compressed by urging of the circuit boards together, and a plurality of bodily-rotatable, electrically conductive interconnect elements, each said interconnect element comprising an axially elongated, preformed rod-like rigid body member inserted in, and extending generally in the direction of the thickness of the resilient elastomeric foam support member, a first terminal member, and a second terminal member, each said terminal member having a width sufficiently greater than the diameter of said rigid body member to resist removal of said interconnect element from said elastomeric support member, said terminal members being disposed generally coaxially with the axis of said body member and being of shape to provide pad engagement surfaces about said axis capable of proper engagement with the respective contact pads, a line projected through said pad engagement surfaces being disposed at an acute angle to the direction of thickness of said support member, and said first and second terminal members further defining support member engaging surfaces disposed about said axis and at least closely in opposition to said support surfaces of said support member during bodily rotation of said interconnect element to locally compress the elastomeric foam of said support member, whereby, when said area array connector device is disposed between the circuit boards in a clamped-together relationship with said interconnect elements in registry with their respective corresponding contact pads and with said interconnect elements rotated bodily as a result of said clamping so that said line projected through said pad engagement surfaces of each element lies at an acute angle, said interconnect elements are resiliently supported by said elastomeric foam support member to bear with force upon the contact pads, and said voids of said elastomeric foam of said support member serve locally to accommodate bodily rotation of said interconnect elements in a manner avoiding disturbance of adjacent elements whereby displacement of the elastomeric foam material of said support member about each said interconnect element is limited generally to the local region of said element.

8. The area array connector device of claim 7 wherein said pad engagement surfaces are disposed generally symmetrically about said axis.

9. The area array connector device of claim 8 wherein said support member engagement surfaces are disposed generally symmetrically about said axis.

10. The area array connector device of claim 9 wherein said pad engagement surfaces are rounded convexly.

11. The area array device of claim 10 wherein said interconnect element has a first body diameter in the region of said body adjacent said terminal member and a second terminal diameter in the region of said terminal member between said pad engagement surface and said support member engagement surface, said second diameter being greater than said first diameter.

12. The area array device of claim 11 wherein said interconnect element being disposed in an aperture extending generally through said support member, said aperture having a diameter generally corresponding to said first body diameter of said interconnect element, the support member engagement surfaces of said terminal elements of said second, greater diameter adapted to bear upon the opposite surfaces of said support member in a manner to resist displacement of said terminal members into said support member.

13. The area array device of claim 12 wherein said support member comprises a film disposed on at least one support surface, the modulus of elasticity of the film allowing application of higher compressional forces than allowed by said elastomeric foam alone.

14. The are array device of claim 13 wherein said film is formed of polyester.

15. The area device of claim 14 wherein said film is formed of Mylar ®.

16. The array connector of claim 10 or 7 wherein said terminal members are substantially axi-symmetric relative to one another.

17. The array connector of claim 1 or 7 wherein said interconnect element and said support members are preformed members, said interconnect element having preformed terminal members that are enlarged relative to said body member and said support member having preformed through-holes that ar smaller than said terminal member, and said interconnect element and support member are cooperatively constructed to enable insertion of said rigid body members by elastomeric yielding of the walls of said through-hole of said support member, during said insertion.

18. The area array connector device of claim 1 or 7 where said pad engagement surfaces conform substantially to sections of a sphere.

19. The array connector of claim 1 or 7 wherein said rigid body member and said terminal members are symmetric about said axis and together conformed substantially to a surface of revolution.

20. The array connector of claim 19 wherein said body member is disposed in a hole of circular cross-section generally corresponding in diameter to the diameter of said rigid body member.

* * * * *

UNITED STATES PATENT AND TRADEMARK OFFICE
CERTIFICATE OF CORRECTION

PATENT NO.  : 5,049,084

DATED       : September 17, 1991

INVENTOR(S) : Stephen M. Bakke

It is certified that error appears in the above-identified patent and that said Letters Patent is hereby corrected as shown below:

Title page:
Under References Cited please insert:

| | | |
|---|---|---|
| 4,593,961 | 6/1986  | Cosmo |
| 4,509,099 | 4/1985  | Takamatsu et al. |
| 4,445,735 | 5/1984  | Bonnefoy |
| 4,402,562 | 9/1983  | Sado |
| 4,330,165 | 5/1982  | Sado |
| 4,295,700 | 10/1981 | Sado |
| 4,064,623 | 12/1977 | Moore |
| 4,008,519 | 2/1977  | Gilissen et al. |
| 4,008,300 | 2/1977  | Ponn |
| 4,003,621 | 1/1977  | Lamp |
| 3,945,196 | 3/1976  | Wood et al. |
| 3,904,934 | 9/1975  | Martin |
| 3,852,878 | 12/1974 | Munro |
| 3,680,037 | 7/1972  | Nellis et al. |
| 3,217,283 | 11/1965 | Shlesinger |
| | | |
| 2 306 547       | | France |
| Appln. 49-3529  | | Japan |
| 2 024 563       | | W. Germany |
| 544,028         | | Russia |

UNITED STATES PATENT AND TRADEMARK OFFICE
CERTIFICATE OF CORRECTION

PATENT NO.   : 5,049,084

DATED        : September 17, 1991

INVENTOR(S)  : Stephen M. Bakke

It is certified that error appears in the above-identified patent and that said Letters Patent is hereby corrected as shown below:

Under Other Publications please insert:

Circuit News, Rogers Offers Area Array Test Kits (December 1989)

Connection Technology (September 1988)

Designfax, Pivoting Connectors Eliminate Pins and Solder (April 1988)

Design News, Device Connects Without Pins (July 4, 1988)

Design News, Foam Sheet Joins Chip Carrier, Circuit Board (February 13, 1989)

ECN Special Report, Connectors for Card Edge & Flat Cable (March 1989)

EDN News, Array Connector (July 6, 1989)

EDN News, Connector System Uses No Pins or Soldering (December 15, 1988)

UNITED STATES PATENT AND TRADEMARK OFFICE
CERTIFICATE OF CORRECTION

PATENT NO.   : 5,049,084
DATED        : September 17, 1991
INVENTOR(S)  : Stephen M. Bakke It is certified that error appears in the above-identified patent and that said Letters Patent is hereby corrected as shown below:

EE Product News, Pinless VLSI Array Connector Uses Elastomeric Foam (April 1988)

Electronic Design, Solderless Interconnections Grow (January 12, 1989)

Electronic Design, New Methods Vie for Dense, Fast Connector Slots (May 11, 1989)

Rogers Corp, Area Array Connector (1987)

Teknit, Conductive Elastomeric Connector (July 1974)

Col. 2, line 5, "element" should be --elements--;

Col. 8, lin 51, "ar" should be --ar--.

Signed and Sealed this

Twenty-third Day of March, 1993

Attest:

STEPHEN G. KUNIN

Attesting Officer      Acting Commissioner of Patents and Trademarks